United States Patent [19]

Motegi et al.

[11] Patent Number: 5,686,211

[45] Date of Patent: Nov. 11, 1997

[54] METHOD AND APPARATUS FOR REMOVING A THIN FILM LAYER

[75] Inventors: Kiyoshi Motegi; Yukako Komaru, both of Kanagawa, Japan

[73] Assignee: Nikon Corporation, Tokyo, Japan

[21] Appl. No.: 542,684

[22] Filed: Oct. 13, 1995

Related U.S. Application Data

[63] Continuation of Ser. No. 360,171, Dec. 20, 1994, abandoned, which is a continuation of Ser. No. 231,878, Apr. 22, 1994, abandoned, which is a continuation of Ser. No. 90,479, Jul. 12, 1993, abandoned, which is a continuation of Ser. No. 685,293, Apr. 12, 1991, abandoned.

[30] Foreign Application Priority Data

Apr. 13, 1990 [JP] Japan ..................... 2-96397

[51] Int. Cl.$^6$ ........................... G03F 7/20
[52] U.S. Cl. ............... 430/30; 430/311; 430/945; 356/345
[58] Field of Search ............... 430/22, 30, 311, 430/945; 356/345

[56] References Cited

U.S. PATENT DOCUMENTS 4,789,611  12/1988  Miyahara .................. 430/30
4,816,361  3/1989  Glendinning .................. 430/30

FOREIGN PATENT DOCUMENTS 1230233  9/1989  Japan ..................... 430/30

*Primary Examiner*—Kathleen Duda
*Attorney, Agent, or Firm*—Michael N. Meller

[57] ABSTRACT

A method and apparatus whereby a thin film layer covering a plurality of marks of a given pattern formed on a surface of a substrate is selectively removed from each of a plurality of localized areas each including one of the marks by irradiation of an energy beam. The mark is detected by a mark detecting system in a noncontact manner during the irradiation of the energy beam or during a time that the irradiation is stopped, thereby producing an electric signal including information corresponding to a change of an optical or physical property of the localized area. In accordance with the electric signal produced by the mark detecting system, it is evaluated whether the information indicative of the optical or physical property of the mark has attained a predetermined condition for a predetermined information processing application of the information. In accordance with a result of the evaluation, it is selected whether the irradiation of the energy beam onto the localized area is to be effected continuously.

6 Claims, 8 Drawing Sheets

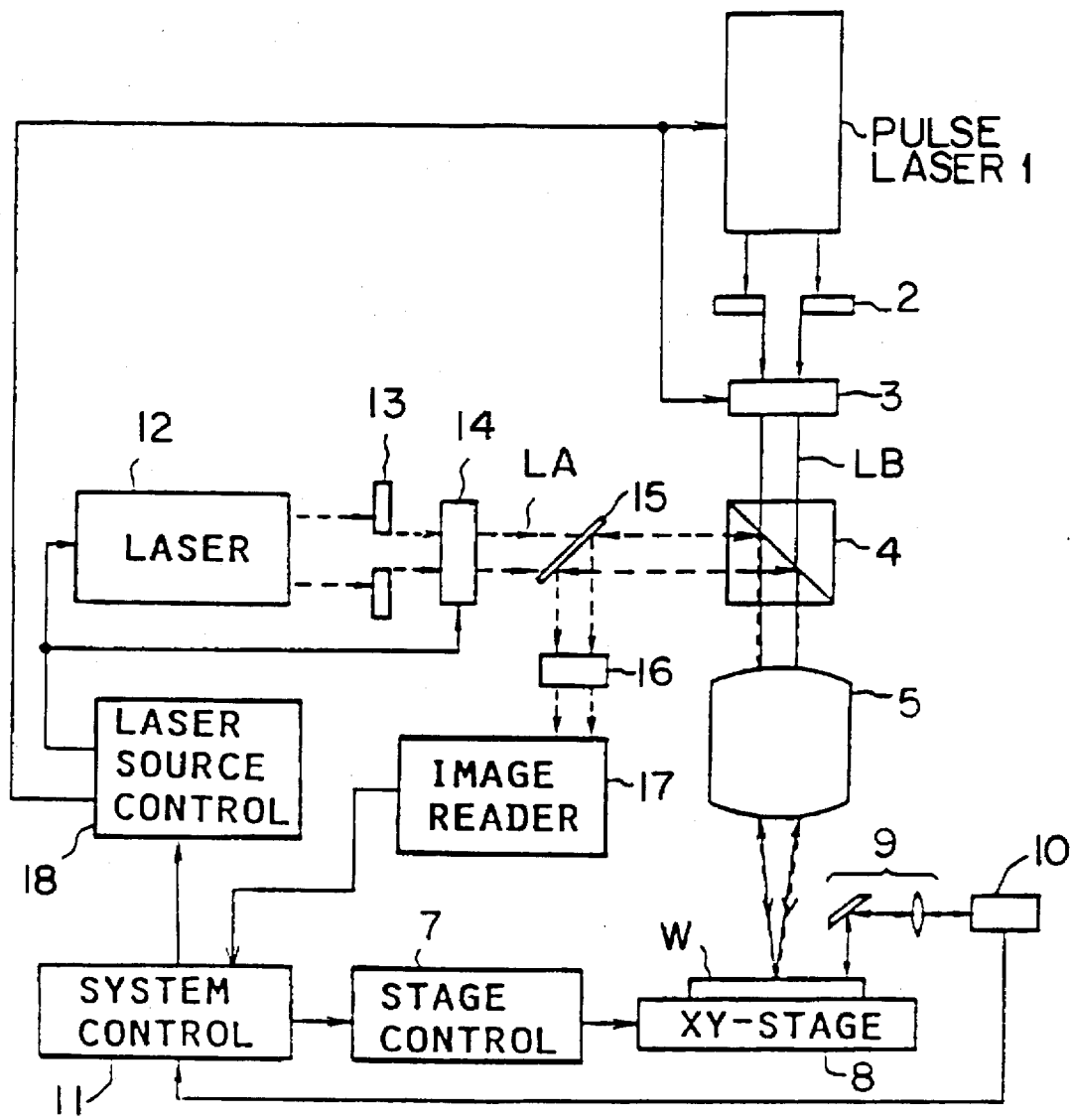
F I G. 1

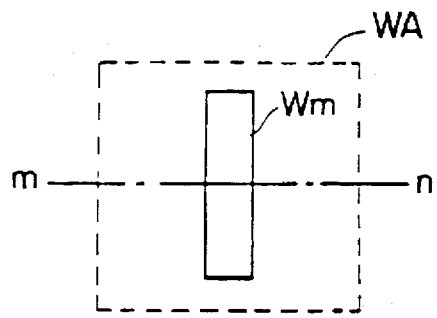
FIG.2a
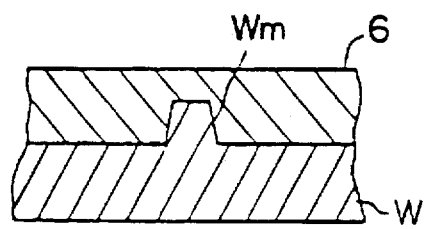
FIG.2b
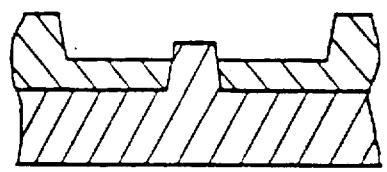
FIG.2c
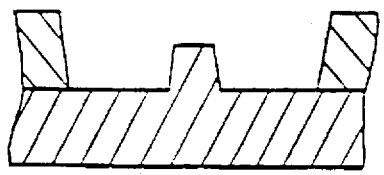
FIG.2d
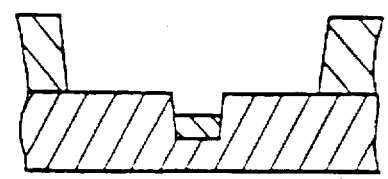
FIG.2e
FIG.2f
FIG.2g
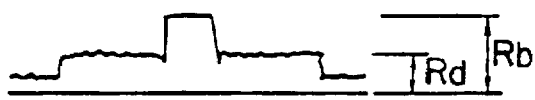
FIG.2h
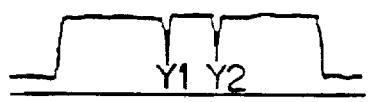
FIG.2i

METHOD AND APPARATUS FOR REMOVING A THIN FILM LAYER

This application is a continuation of application Ser. No. 08/360,171, filed Dec. 20, 1994, now abandoned, which is a continuation of application Ser. No. 08/231,878, filed Apr. 22, 1994, now abandoned, which application is a continuation of application Ser. No. 08/090,479, filed Jul. 12, 1993, now abandoned, which is a continuation of application Ser. No. 685,293, filed Apr. 12, 1991, now abandoned.

BACKGROUND OF THE INVENTION

1. Field of the Invention

The present invention relates to a method and apparatus for locally removing a thin film layer covering the surface of a substrate such as a semiconductor wafer, and more particularly the invention relates to techniques whereby in order to improve the alignment accuracy in a photolithographic apparatus (particularly exposure apparatus) used for example in the manufacture of semiconductor integrated circuits, the photoresist coating on the surface of a substrate which has been preliminarily formed with IC patterns including alignment marks is irradiated by a beam of energy to remove it from the localized areas including the alignment marks.

2. Description of the Prior Art

With the recent trend toward increasing the level of integration of VLSI patterns, the minimum linewidth of circuits has also been reduced. It is expected that an excimer stepper employing as its light source a deep UV light source, e.g., a KrF (krypton fluoride) excimer laser having a wavelength of 248 nm is used in the manufacture of the next generation memories whose minimum linewidth on semiconductor chips is supposed to be on the order of 0.35 μm, e.g., 64-Mbit D-RAMs (dynamic random access memories).

With this type of excimer stepper, it is desirable to effect an alignment measurement (mark detection) of the so-called through-the-reticle (or TTR) method through a reticle serving as a projection negative and a projection lens so as to improve the accuracy of alignment (particularly wafer alignment).

In order to effect this TTR alignment, however, excellent measurement of the mark position cannot be effected unless light of the same wavelength as the exposure light is used as the illuminating light required for the detection of the alignment marks on the wafer.

The reason is that the projection lens system used in the excimer stepper involves strong chromatic aberrations so that the conjugate relation between the reticle and the wafer through the projection lens cannot be maintained by a non-exposure light such as a visible light.

In view of these circumstances, it is conceivable to use the excimer laser light splitted from the same light source as the exposure light as the required illuminating light for the alignment system of the TTR type in the excimer stepper. Where the alignment measurement is effected by use of the excimer laser light, however, the energy of the excimer laser light is frequently absorbed intensely by the resist layer uniformly applied onto the wafer. For instance, in the case of a resist of novolak-type resin such as the MP-2400 (the tradename of Shipley Co.) in the form of a coating layer of 1 μm in thickness, the transmittance is as low as about 5 to 8% and also in the alignment measurement the amount of the light entering the resist layer and then reflected by the mark to return to the projecting lens system passing again through the resist layer is represented by a returnable transmittance through the resist layer, thus causing it to expect the transmittance of about 0.64% at the most. With such low transmittance, it is absolutely impossible to effect the alignment measurement so that even if the mark detection itself is possible, the resulting position measuring accuracy and repeatability are extremely deteriorated.

On the other hand, each of the alignment marks formed on the wafer is generally composed of a small stepped structure and therefore the film thickness of the resist is unavoidably nonuniform around the marks. Thus, where even if the mark position measurement is effected by use of a non-exposure light, the alignment accuracy tends to be deteriorated due for example to the fact that the interference effect of light peculiar to the thin film becomes prominent in the vicinity of the mark, that the variations in the resist film thickness are unavoidably made unsymmetric on both sides of the mark and so on.

Thus, in an attempt to overcome this problem, it has been conceived to remove only the resist layer on the localized areas which are formed with the alignment marks prior to the commencement of the alignment measurement.

FIG. 8 shows a conventional method of locally removing the resist layer on the alignment mark portions by the irradiation of an energy beam. In FIG. 8, an energy beam, e.g., a laser beam LB projected from a laser light source 81 is formed into a given beam cross-sectional shape by a variable aperture stop 82 and it reaches a shutter 83. The shutter 83 passes or blocks the laser beam LB so that the laser beam passed through the shutter 83 is reflected by a mirror 84 and then it falls on an objective lens 85. The laser beam LB is focused as a spot of the same shape as the opening of the variable aperture stop 82 on a wafer W through the objective lens 85 and the resist layer on the wafer W is subjected to energy irradiation by the spot. In the portion irradiated by the spot of the laser beam LB, the bond of the molecules in the resist is broken so that they are scattered as fine particles and according to circumstances they are further oxidized so as to be removed in the form of volatile substance. The mirror 84 is a dichroic mirror and its properties are such that the laser beam LB is reflected with high efficiency and light of longer wavelengths than the laser beam LB is transmitted.

A resist removal monitoring illumination system (including a light source) 89 generates an illuminating light LA of a wavelength (it may be any of a short-wavelength, multi-wavelength and one having a band width) which is well suited for measuring the reflectance of the wafer surface in the area irradiated by the laser beam LB (the reflectances of the resist layer and the surface of the wafer W itself below the former) and which is longer than that of the laser beam LB. After it has been reflected by a half mirror 88, the illuminating light LA is transmitted through the mirror 84, falls on the objective lens 85 and then is projected onto the previously mentioned irradiated area on the wafer W. The reflected light from the resist layer on this area or the surface of the wafer W falls on a condenser lens 86 through the objective lens 85, the mirror 84 and the half-mirror 88 so that the light is condensed on the photosensitive surface of a photoelectric detector 87. The resulting photoelectric signal reflects the reflectance of the resist layer removed area on the wafer W so that since the resist and the primary coat are generally different in reflectance from each other, the end point of the removal of the resist layer is detected in accordance with the reflectance variations (the signal intensity variations). For instance, where the laser light source 81 comprises for example an excimer laser source which generates a pulse laser, the pulse laser is irradiated continuously so that when the end point is detected, the generation of the pulse laser is stopped or alternatively the irradiation is forcibly stopped by the shutter 83. On the other hand, where the laser light source 81 is one which generates a continuous wave (CW) laser, similarly the irradiation is stopped by the shutter 83 when the end point is detected.

Also, since the properties of the ordinary resist are such that it produces fluorescent light when subjected to the irradiation of ultraviolet rays, it is conceivable to construct so that a fluorescent light detecting system or the like is used in place of the reflectance measurement so as to stop the irradiation of the laser beam LB when the detected amount is reduced to substantially zero.

In the case of the previously mentioned reflectance measurement or the end point detecting method utilizing the detection of the generation of fluorescent light, however, the reflectance or the amount of fluorescence generation is varied at the time of the complete removal of the resist on the area to be removed and therefore there is the possibility of the alignment mark on the wafer being damaged already upon the stopping of the irradiation of the pulse laser beam LB. This problem becomes more apparent in cases where the resist is irradiated by a more intensive energy beam so as to increase the removing rate of the resist.

Since the alignment measurement in the exposure apparatus must be effected by photoelectrically detecting the reflected light, scattered light, diffracted light or the like from the alignment mark having a stepped structure, if all or part of the mark is broken off or the symmetry of the mark shape is ruined by damages, this gives rise to a problem that the alignment accuracy is deteriorated considerably. In other words, with the previously mentioned resist removing methods, there are cases where even if the processing is effected while performing the end point detection, the required photoelectric signal cannot be obtained when the alignment measurement is actually effected in the exposure apparatus.

SUMMARY OF THE INVENTION

The present invention has been made in view of these circumstances and it is the primary object of the present invention to provide a thin film removing method and apparatus therefor which are capable of realizing the required alignment with greater accuracy in an exposure apparatus.

In accordance with a thin film removing method based on the basic idea of the present invention, the thin film layer covering marks of a given pattern formed on the surface of a substrate is selectively removed from the localized areas including the marks by the irradiation of an energy beam. This method is characterized by comprising the steps of generating an electric signal including information corresponding to a change of the optical or physical property of the localized area by mark detecting means adapted for noncontact detection of the mark during the irradiation of the energy beam or during the time that the irradiation is stopped, evaluating whether the information indicative of the optical or physical property of the mark has attained a predetermined condition for a predetermined information processing application of the information in accordance with the electric signal, and selecting whether the irradiation of the energy beam onto the localized area is to be effected continuously in accordance with the result of the evaluation.

What is meant by the predetermined condition in the evaluation step is typically a full contrast condition for the alignment measurement in the exposure apparatus and in this case whether the information is sufficient for the alignment measurement is evaluated in accordance with the electric signal, thereby stopping the irradiation of the energy beam as soon as it is evaluated to be sufficient.

Also, a thin film removing apparatus according to one aspect of the present invention is characterized in that it comprises an apparatus for selectively removing a thin film layer covering marks of a given pattern formed on the surface of a substrate from its localized areas including the marks by the irradiation of an energy beam and the apparatus comprises mark detecting means for generating an electric signal including information corresponding to a change of the optical or physical property of the localized area by detecting the mark in a noncontact manner during the irradiation of the energy beam or during the time that the irradiation is stopped, evaluation means responsive to the electric signal generated from the mark detecting means to evaluate whether the information indicative of the optical or physical property of the mark has attained a predetermined condition for a predetermined information processing application of the information, and decision means responsive to the result of the evaluation by the evaluation means to select whether the irradiation of the energy beam to the localized area is to be effected continuously.

The predetermined condition of the evaluation means is also typically a contrast condition sufficient for the alignment measurement in the exposure apparatus and in this case whether the information is sufficient for the alignment measurement is evaluated in accordance with the electric signal, thereby stopping the irradiation of the energy beam as soon as it is determined to be sufficient.

In a thin film layer removing method according to another aspect of the present invention, during the irradiation of a thin film layer removing energy beam or during the irradiation stopping period the mark detecting means of the thin film layer removing apparatus combined with the exposure apparatus for the substrate detects an electric signal including information corresponding to a change of the optical or physical property of the localized area including the alignment mark on the substrate and in accordance with this electric signal an evaluation is made as to whether the information indicative of the optical or physical property of the alignment mark has attained a given contrast condition suited to the information processing for the alignment operation by the alignment measuring system provided in the exposure apparatus. Then, in accordance with the result of the evaluation, a selection is made as to whether the irradiation of the energy beam to the localized area is to be effected continuously.

In other words, in accordance with the present invention the end point of the removing processing of the thin film layer can be determined by the fact that the information indicative of the optical or physical property of the alignment mark has attained a given condition suited to the information processing for the alignment operation in the alignment measuring system of the actual exposure apparatus instead of whether the thin film layer on the localized area has been removed completely, so that if it is determined that a signal including the necessary information for the alignment operation can be obtained, even if the thin film layer is more or less left on the localized area, the irradiation of the energy beam is stopped and thus the mark formed on the substrate in the localized area is effectively prevented from being damaged.

The present invention can be suitably combined with the exposure apparatus. Generally, while the alignment measuring system of the exposure apparatus is composed of a light transmission system for irradiating an illuminating light having a given wavelength characteristic onto the alignment mark formed on the substrate and a photosensing system for photoelectrically detecting light information generated from the alignment mark by the irradiation of the illuminating light, in this case it is preferable that in the thin film layer removing apparatus of the present invention the mark detecting means is substantially identical in construction with the alignment measuring system of the exposure apparatus so that a light beam of substantially the same wavelength as the illuminating light of the alignment measuring system is irradiated onto the localized area.

More specifically, there must be a coincidence between the mark detecting means and the alignment measuring system with respect to the basic forms such as whether the diffracted light returned from the alignment mark is detected, along with its zero-order light, to detect the reflection or interference pattern of the alignment mark or alternatively the zero-order light is cut off to detect the intensity of the diffracted light. Also, while there is no need that the wavelength of the light beam irradiated onto the localized area from the light transmission system of the mark detecting means is exactly the same with that of the illuminating light from the alignment measurement system of the exposure apparatus, the absorptance and the refractive index in the thin film layer on the substrate must be in such ranges that there are no great differences from those of the illuminating light from the alignment measurement system. The reason is that if the photosensing method and the wavelength of the light beam of the mark detecting means differ greatly from these conditions of the alignment measuring system in the exposure apparatus, the signal generated from the alignment measuring system of the exposure apparatus corresponds no longer to the signal generated from the alignment measuring system of the exposure apparatus and a situation can arise in which the required signal for the alignment operation cannot be generated in the exposure apparatus.

As described hereinabove, in accordance with the present invention, by virtue of the fact that instead of evaluating whether the thin film layer on the localized area is removed completely, an electric signal including information corresponding to a change of the optical or physical property of the localized area including the alignment mark is detected so that in accordance with this electric signal, an evaluation is made as to whether information indicative of the optical or physical property of the alignment mark is generated in a given state from the alignment measuring system of the exposure apparatus and the end point of the thin film layer removal is determined according to the result of the evaluation, thereby ensuring an excellent removal of the thin film layer from the localized area without causing any damage to the alignment mark by the irradiation of the necessary and minimum energy beam.

By effecting the thin film layer removal of the desired area including the alignment mark prior to the alignment measurement for the exposure by use of the method and apparatus according to the present invention, it is possible to positively produce a signal including the required information for the position measurement of the alignment mark without causing damages to the alignment mark in the alignment measurement system of the exposure apparatus, thereby improving the alignment accuracy of the exposure apparatus.

The above-mentioned thin film layer removing method and apparatus of the present invention are extremely useful when effecting the alignment operation of the TTR type in the photolithographic process for the manufacture of integrated circuits.

The above and other features and advantages of the present invention will become more apparent from the following description of the illustrated embodiments.

BRIEF DESCRIPTION OF THE DRAWINGS

FIG. 1 shows the construction of a resist (thin film) layer removing apparatus according to an embodiment of the present invention, FIGS. 2a to 2i are conceptional diagrams for explaining the resist removing process in the resist removing apparatus shown in FIG. 1.

DESCRIPTION OF THE PREFERRED EMBODIMENTS

The present invention will now be described by way of its embodiment applied to the case of removing the resist layer on localized areas including alignment marks on a wafer with reference to the drawings.

Prior to proceeding with the description of the resist layer removing apparatus of the present embodiment, the basic TTR-type alignment system of an exposure apparatus will be described first with reference to FIGS. 4 and 5. It is to be noted that an alignment method of the type in which an alignment measurement light is passed through the projection lens alone with passing through the reticle is called as a TTL (through-the-lens) method and FIG. 4 additionally shows an alignment measurement system of the TTL type (an LSA system 43) which will be described later.

Figure 4:
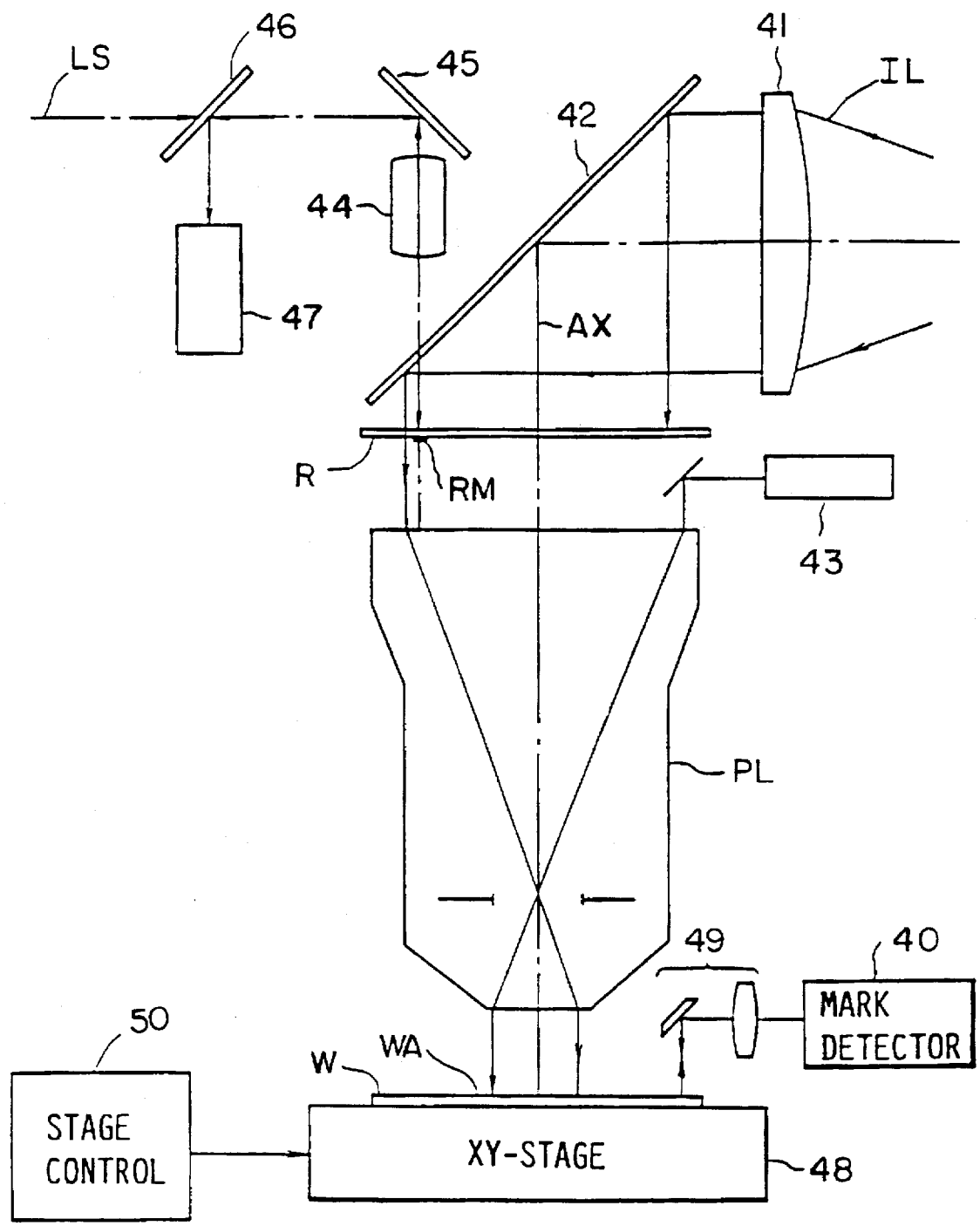
FIG. 4 shows the construction of the principal parts of an exposure apparatus.

Referring to FIG. 4, a wafer W is mounted on an XY-stage 48 which is two-dimensionally moved in an X direction and a Y direction under the control of a stage controller 50. The position of the XY-stage 48 is detected at all times by laser interferometers or the like and the detection result is fed as position information back to the stage controller 50. The global alignment between a reticle R and the exposure field of the wafer W is effected on the wafer W with the accuracy for example of ±0.01 µm through the movement of the XY-stage 48. The global alignment is accomplished by detecting the marks at the specified positions on the wafer W from above the resist layer through a global alignment optical system 49 and a mark detector 40. After the global alignment operation has been completed, a TTR alignment operation is performed with respect to both the X and Y directions of the wafer. While FIG. 4 shows only the optical system required for the TTR alignment operation in one direction for purposes of simplicity, in fact the alignment optical systems which are indentical in construction and component elements are respectively provided for the X and Y directions.

In the TTR alignment optical system shown in FIG. 4, an alignment light LS is directed from a light source which is not shown through a mirror 46 to reach a second mirror 45 from which it is reflected and irradiated onto a reticle mark area RM on the reticle R through a lens optical system 44 and a dichroic mirror 42. This alignment light LS is an illuminating light in the same wavelength region as an exposure light IL (the g line, i line, KrF excimer laser or the like) for the IC pattern on the reticle in this exposure apparatus and it is in the form of a light beam shaped into substantially the same beam cross-sectional shape as the mark area RM of the reticle by an aperture stop or the like which is not shown. For instance, where the exposure light IL is the KrF excimer laser (wavelength 248 nm), the second harmonic (wavelength 255 nm) of the copper vapor laser can be used as the alignment light LS.

Figure 5A:
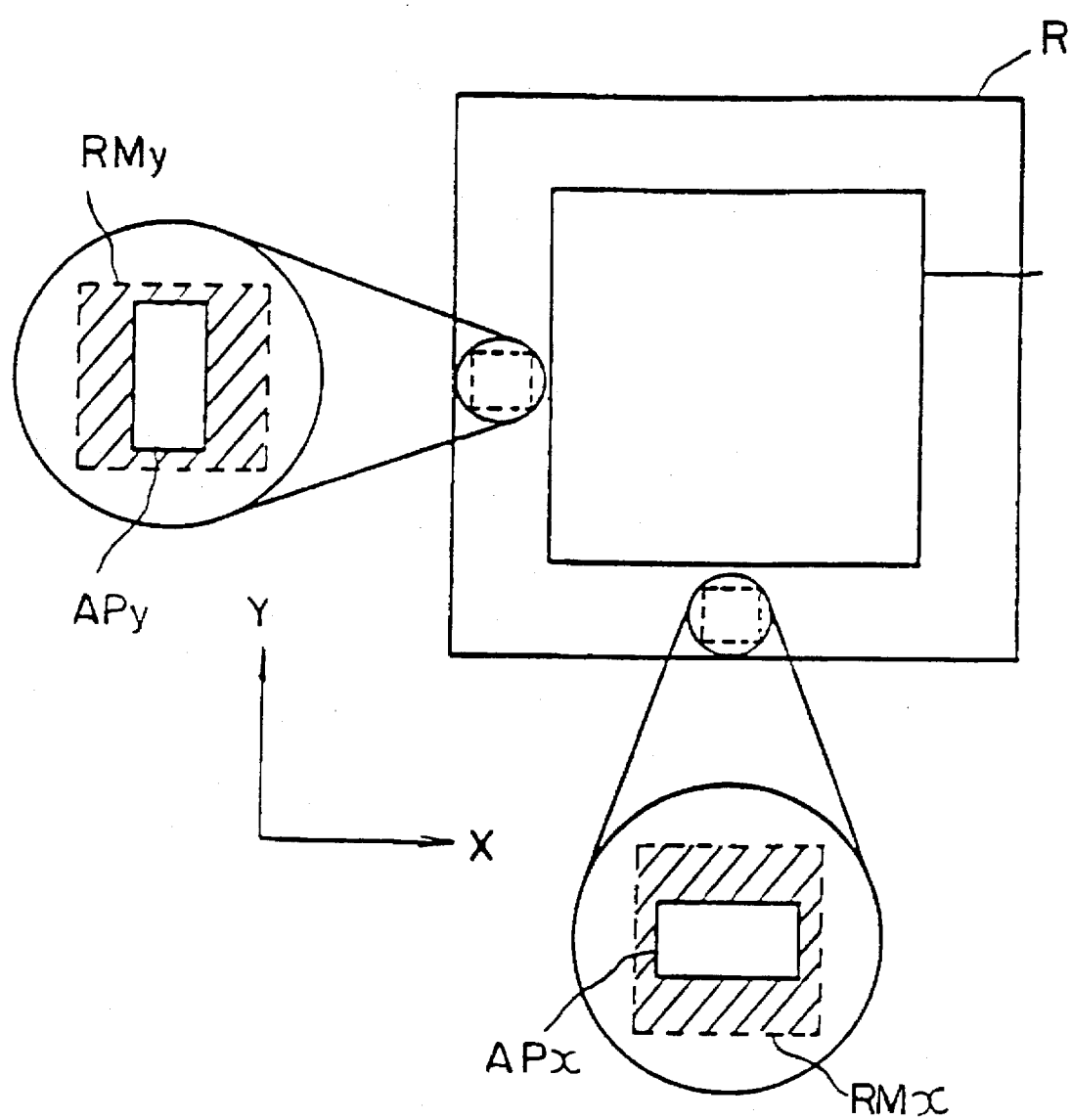
FIG. 5a is a conceptional diagram for explaining the alignment marks formed on a reticle.

As shown in FIG. 5a, the reticle mark areas RM are provided in the form of $RM_x$ and $RM_y$ on the outer side of an IC exposure pattern area PE in the X and Y directions thereof. Apertures $AP_x$ and $AP_y$ are respectively formed in the reticle mark areas $RM_x$ and $RM_y$ in such a manner that their longitudinal directions represent for example the X and Y directions as shown in FIG. 5a and the portions of the apertures $AP_x$ and $AP_y$ transmit the alignment light LS, and the other portions (the hatched portions in the Figure) of the reticle mark areas $RM_x$ and $RM_y$ are made of thin films of chromium or the like which do not transmit the alignment light LS.

Figure 5B:
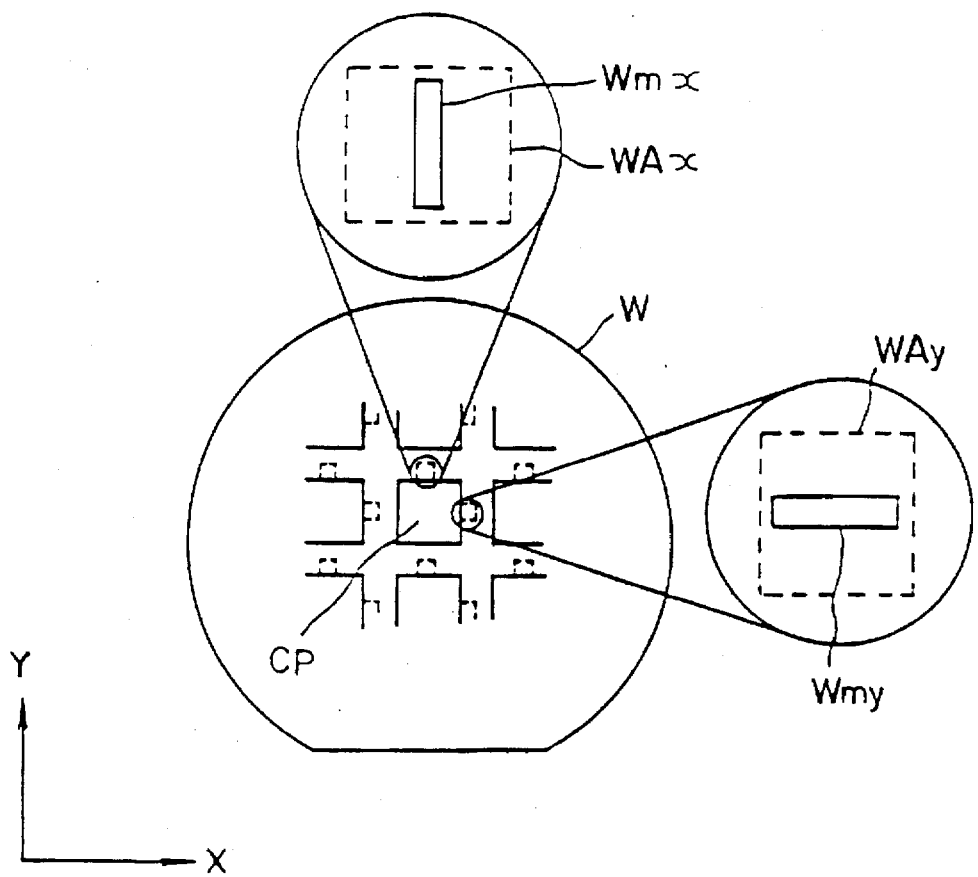
FIG. 5b is a conceptional diagram for explaining the alignment marks formed on a wafer.

The alignment light LS transmitted through the aperture $AP_x$ or $AP_y$ irradiates the wafer mark area (the localized area including the wafer alignment mark) $WA_x$ or $WA_y$ on the wafer W through a reduction projection lens PL. As shown in FIG. 5b, a large number of IC exposure fields CP are arranged in a matrix form on the wafer W and the wafer mark areas $WA_x$ and $WA_y$ are respectively formed in the X and Y directions in association with each field CP. The wafer mark areas $WA_x$ and $WA_y$ in the X and Y directions are each formed with a rectangular wafer mark $W_{mx}$ or $W_{my}$ whose longitudinal direction represents for example the Y or X direction as shown in the Figure. The wafer marks $W_{mx}$ and $W_{my}$ are each formed as a stepped structure which is concave or convex relative to the surrounding portion within the wafer mark area $WA_x$ or $WA_y$.

Figure 5C:
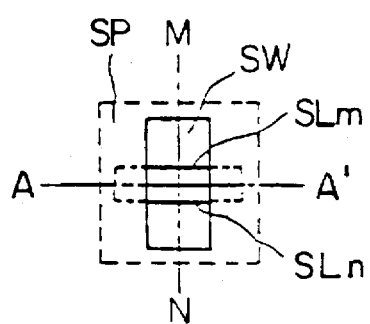
FIGS. 5c and 5d are conceptional diagrams for respectively explaining the reflection pattern from a wafer mark area and its luminance signal waveform.
Figure 5D:
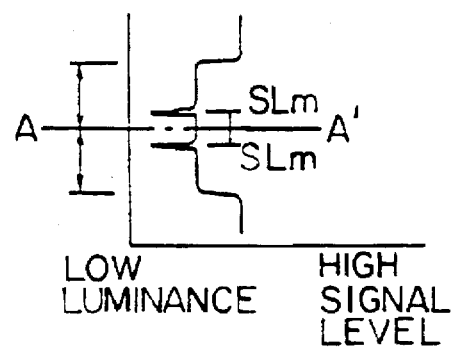

The alignment light LS reflected from the wafer mark area $WA_x$ or $WA_y$ is again passed through the reduction projection lens PL and the aperture $AP_x$ or $AP_y$ of the reticle mark area $RM_x$ or $RM_y$ and through a dichroic mirror 42 and an optical system 44, reflected by mirrors 45 and 46 and directed to an image reader 47 whose image pickup device is a two-dimensional or one-dimensional image sensor.

Where the image reader 47 employs a two-dimensional image sensor (area sensor), the read image pattern comprises a high luminance portion SP by the reflection from the Cr coating within the reticle mark area $RM_x$ or $RM_y$, a reflected portion SW (corresponding to the shape of the aperture $AP_x$ or $AP_y$ of the reticle mark area $RM_x$ or $RM_y$) from the wafer mark area $WA_x$ or $WA_y$ and a dark line $SL_m$ or $SL_n$ due to the interference of the stepped portion of the wafer mark $W_{mx}$ or $W_{my}$ as shown in FIG. 5c. Although it is dependent on the material constituting the wafer mark $W_{mx}$ or $W_{my}$, the luminance of the reflected portion SW is generally lower than that of the reflected portion SP from the Cr coating of the reticle mark area $RM_x$ or $RM_y$. Since the longitudinal directions of the rectangular shapes of the aperture $AP_x$ or $AP_y$ of the reticle mark area $RM_x$ or $RM_y$ and the wafer mark $W_{m x}$ or $W_{m y}$ are determined in such a manner that they cross each other at right angles in the image pattern on the image sensor, in the image pattern the longitudinal directions of the reflected portion SW from the wafer mark area $WA_x$ or $WA_y$ and the dark line $SL_m$ or $SL_n$ are observed in the directions which cross each other at right angles. From such composite image pattern are measured the positional relations of a center line A–A' of the portion SW and the dark lines $SL_m$ and $SL_n$ relative to a longitudinal direction M–N of the portion SW so that the XY-stage 48 is slightly moved in the X direction or the Y direction in a manner that the dark lines $SL_m$ and $SL_n$ are observed at the positions which are symmetric with the center line A–A', thereby performing the alignment in such a manner that the positions of the dark lines $SL_m$ and $SL_n$ are simultaneously observed at the positions which are symmetrical with respect to the center line A–A' of the portion SW by the X-direction and Y-direction alignment optical systems. As a result, the relative alignment of the exposure areas of the reticle R and the wafer W is accomplished with a high degree of accuracy.

Where the image reader 47 employs a one-dimensional image sensor (line sensor), the sensor is arranged in such a manner that its reading direction is along the line segment M–N of FIG. 5c. At this time, the luminance signal pattern read from the linear image sensor is decreased in level in a steplike manner in the portion SW as shown in FIG. 5d and the luminance signal shaply drops in a spikelike manner at the positions corresponding to the dark lines $SL_m$ and $SL_n$. The positional relations of the center line A–A' of the portion SW and the dark lines $SL_m$ and $SL_n$ are measured from this luminance signal pattern and the alignment is effected in such a manner that the dark lines $SL_m$ and $SL_n$ are observed at the positions symmetrical with the center line A–A'.

After the relative alignment of the wafer W and the reticle R has been effected in this way, the exposure light IL is emitted. The exposure light IL is passed through a condenser lens 41 and reflected by the dichroic mirror 42, thereby illuminating the pattern area PE of the reticle R with a uniform luminance. After passing through the pattern area PE, the exposure light IL falls on the projection lens PL so that the projection lens PL reduces and projects an image of the circuit pattern on the given field of the wafer.

Next, an embodiment of the resist layer removing apparatus according to the present invention will be described with reference to FIG. 1. The laser light LB emitted from a pulse laser light source 1 such as an excimer laser is formed into a given beam shape by a variable aperture stop 2 and then it is led to a shutter 3. The shutter 3 passes or blocks the laser light LB so that after passing through the shutter 3, the laser beam is further passed through a beam splitter 4 and then it falls on an objective lens 5. The laser beam LB focused by the objective lens 5 is formed into a spot of the similar shape as the opening shape of the variable aperture stop 2 on the wafer W, thereby illuminating the resist layer on the wafer W.

Then, the wafer W is mounted on an XY-stage 8 which is moved two-dimensionally in X and Y directions under the control of a stage controller 7. The position of the XY-stage 8 is detected at all times by laser interferometers or the like which are not shown so that the detection result is fed as position information back to the stage controller 7 and thus the irradiation position of the laser beam LB is aligned on the wafer W with an accuracy for example of ±0.01 μm through the movement of the XY-stage 8. It is to be noted that as regards the relative alignment of the laser beam LB and the wafer W, the similar effect can be obtained by scanning or vibrating the laser beam LB relative to the wafer W. An alignment optical system 9 for detecting the global alignment marks formed at the specified positions on the wafer W is fixedly arranged at a position which is for example different from the objective lens 5 and it performs, along with a mark detector 10 comprising a photoelectric sensor or the like, the off-axis type alignment operation of the wafer W. An alignment signal is supplied to a system controller 11 from the mark detector 10. This alignment signal is generated when the center of the mark formed at the specified position on the wafer W so that the position of the XY-stage 8 at the time of the generation of this signal is stored as a reference point by the system controller 11 and the establishment of correspondence (global alignment) between the irradiation position of the laser beam LB and an arbitrary point on the wafer W is completed. As a result, the XY-stage 8 can be moved in such a manner that the laser beam LB is irradiated onto the wafer mark area requiring the removal of the resist.

On the other hand, a laser beam LA emitted from a laser light source 12 and in the same wavelength region as the alignment light used in the previously mentioned exposure apparatus is formed into a given beam shape by a variable aperture stop 13 and then it arrives at a shutter 14. The shutter 14 passes or blocks the laser beam LA so that the laser beam passed through the shutter 14 is transmitted through a half-mirror 15 and it falls on the splitter 4. The laser beam LA is reflected downwardly by 90 degrees by the beam splitter 4 and it falls on the objective lens 5. The spot of the laser beam LA focused on the wafer W through the objective lens 5 has the similar shape as the opening shape of the variable aperture stop 13 on the wafer W and this spot of the laser beam LA irradiates the wafer mark area of the wafer W. Where the resist layer on the wafer W is of the type which absorbs the laser beam LA, the reflected light of the laser beam LA reflected from the wafer W itself or the undercoat of the resist layer is returned through the initial light path through the objective lens 5 and the beam splitter 4 and it is then reflected by a half-mirror 15 to fall on an image reader 17 through a wavelength selector filter 16. The image reader 17 reads by photoelectric conversion the reflected light signal from the wafer mark area or the signal including information indicative of the optical or physical property of the alignment mark and it further subjects the signal to image processing, thereby transmitting the signal to the system controller 11. In the present embodiment, mark detecting means is formed by a system comprising the above-mentioned laser light source 12, variable aperture stop 13, shutter 14, half-mirror 15, beam splitter 4, objective lens 5, wavelength selector filter 16 and image reader 17. In addition, the image reader 17 also serves the roles as evaluation means and decision means so that as will be described later, in accordance with the detected reflected light signal the alignment measuring system of the exposure apparatus evaluates whether the reflected light signal from the wafer mark area has attained a given contrast condition for its information processing and it also makes a selection as to whether the irradiation of the resist removing laser beam LB is to be continued in accordance with the result of the evaluation.

In addition to the previously mentioned control of the XY-stage, the system controller 11 receives the signal from the image reader 17 and sends it to a laser source control 18, thereby controlling the irradiation of the laser beam onto the wafer W through the ON/OFF control of the laser oscillation of the laser light sources 1 and 12 or through the opening and closing of the shutters 3 and 14.

Then, a description will be made of the resist removing process and the signal pattern detected by the image reader 17 in the present embodiment.

The alignment is effected by the stage controller 7 in such a manner that the laser beams LB and LA irradiate the wafer mark area on the wafer W and their irradiation spots are respectively set to have the same shapes as the wafer mark areas $WA_x$ and $WA_y$ described in connection with FIG. 5b by the aperture stops 2 and 13. The irradiation of the two laser beams LA and LB by the laser source control 18 may be effected simultaneously or alternately. Also, where the laser light source 12 produces a CW laser, the irradiation of the laser beam LA may be effected continuously during the process which will be described hereunder.

Assume now that the wafer mark area to be irradiated by the laser beams LB and LA is the area WA of FIG. 2a and the wafer mark $W_m$ is formed within this area. Where the wafer mark $W_m$ is composed of a step which is convex relative to the surrounding region, the cross-sectional shape along the line m-n becomes as shown in FIG. 2b. Where the wafer W is for example a silicon wafer, the wafer mark $w_m$ portion is made of $SiO_2$, $Si_3N_4$, poly-Si, Al or the like and a resist layer 6 is applied onto the top of the wafer W so as to cover the mark. When the irradiation of the laser beam LA is effected in the condition of FIG. 2b where the removal of the resist layer 6 is not initiated as yet, practically all of the laser beam LA is absorbed by the resist layer 6 so that as shown in FIG. 2f, the convex portion of the wafer mark $w_m$ does not appear in the luminance signal on the segment m-n of the reflected light pattern of the laser beam LA detected by the image reader 17, thereby failing to obtain the pattern signal required for effecting the position detection during the alignment. When the removal of the resist layer 6 is initiated, the bond of the molecules is broken in the resist on the wafer mark area WA by the irradiation of the laser beam LB so that the resist is scattered in the form of fine particles or the fine particles are further oxidized and are removed as volatile substance such as $CO_2$ or $H_2O$. In synchronism with the irradiation of the laser beam LB, the reflected light of the laser beam LA is read by the image reader 17. In this case, if the laser beam LA or LB is an ultraviolet laser and the reflected light of the observation laser beam LA is read simultaneously with the irradiation of the processing laser beam LB, in order to distinguish this reflected light from the fluorescent light produced by the resist due to the irradiation of the ultraviolet laser, the wavelength selector filter 16 which is designed to transmit the wavelength of the laser beam LA with high efficiency and block the undesired wavelengths such as the fluorescent light must be arranged before the image reader 17. Where the laser beams LB and LA irradiated simultaneously, the wavelength selector filter must have such property that the reflected light of the laser beam LB is also cut off.

FIG. 2c shows the condition where the removing process of the resist layer 6 is now in progress, i.e., the condition in which the convex portion of the wafer mark $w_m$ is exposed and the resist is remaining on the remaining mark area. In this condition, the luminance signal waveform on the segment m-n of the reflected light pattern of the laser beam LA detected by the image reader 17 is such that the intensity Rb of the reflection from the convex portion of the exposed wafer mark is high and the intensity Rd of the reflection from the other portion covered by the resist layer 6 is low due to the absorption of the resist layer 6 as shown in FIG. 2g.

FIG. 2d shows the condition where the removal of the resist layer 6 is finished completely and in this condition the whole portion of the wafer mark area WA is exposed this condition, as shown in FIG. 2h, low reflection intensity spike portions $r_1$ and $r_2$ corresponding to the stepped edges of the exposed wafer mark $w_m$ appear in the luminence signal waveform of the reflected light pattern on the segment m–n of the laser beam LA detected by the image reader 17. In the past, the signal having the condition of FIG. 2h has been used for the alignment in the exposure apparatus.

Where the wafer mark $w_m$ is convex relative to the surroundings, as previously described in connection with FIGS. 2c and 2g, in the luminence signal of the reflected pattern of the laser beam LA the ratio Rb/Rd between the reflection intensity Rb from the convex portion of the wafer mark and the reflection intensity Rd from the other portion becomes maximum at a certain time during the removal of the resist layer 6. On the other hand, where the wafer mark $w_m$ is concave relative to the surroundings, while, as for example, the surrounding portion of the mark $w_m$ is exposed first and the resist is left in the concave wafer mark portion as shown in FIG. 2e, in this condition the luminance signal waveform of the reflected pattern goes to a low level Rb at the mark portion where the resist remains and its ratio to a signal level Rd for the surrounding portion or Rd/Rb is increased to the maximum.

In other words, in either of the cases of FIGS. 2c and 2e, the amplitude contrast between the level Rb of the mark portion and the level Rd of the surrounding portion is increased to the maximum in the luminance signal waveform of the reflected pattern at a certain time.

The image reader 17 subjects the read luminance signal of the two-dimensional reflected pattern from the wafer mark area WA to image processing so that the previously mentioned Rb/Rd or Rd/Rb is determined depending on whether the wafer mark is a convex mark or concave mark and a command is applied to the system controller 11 to stop the irradiation of the laser beams LB and LA when the ratio attains the maximum value or exceeds a threshold value. When this command is received, the system controller 11 stops the irradiation of the laser beams by stopping the laser light sources 1 and 12 or closing the shutters 13 and 14 through the laser source control 18. In this case, while, if the wafer mark $w_m$ is damaged originally by any chance, a luminance signal of a given condition cannot be obtained even if the convex portion of the wafer mark is exposed and thus the irradiation of the laser beams LB and LA is continued further even after the resist has been removed completely, in order to prevent this, it is only necessary to separately provide auxiliary end point detecting means (not shown) for detecting the end point of the resist removal (the end point is reached at the time that the resist is no longer present in the mark area) on the basis of the amount of fluorescent light from the resist or the reflected light intensity from the wafer mark area in accordance with the conventional method. By so doing, even in cases where the wafer mark $w_m$ is defective or damaged by any chance from the first, at least the laser beams LB and LA can be stopped utilizing the time of the complete removal of the resist as the end point and thus it is possible to avoid the inconvenience of continuing the useless laser irradiation.

As the result of the above-described processes, the removal of the resist on one of the wafer marks is completed. Where there are any other wafer marks requiring the removal of the resist, the above-described series of resist removing processes are successively repeated.

Figure 3:
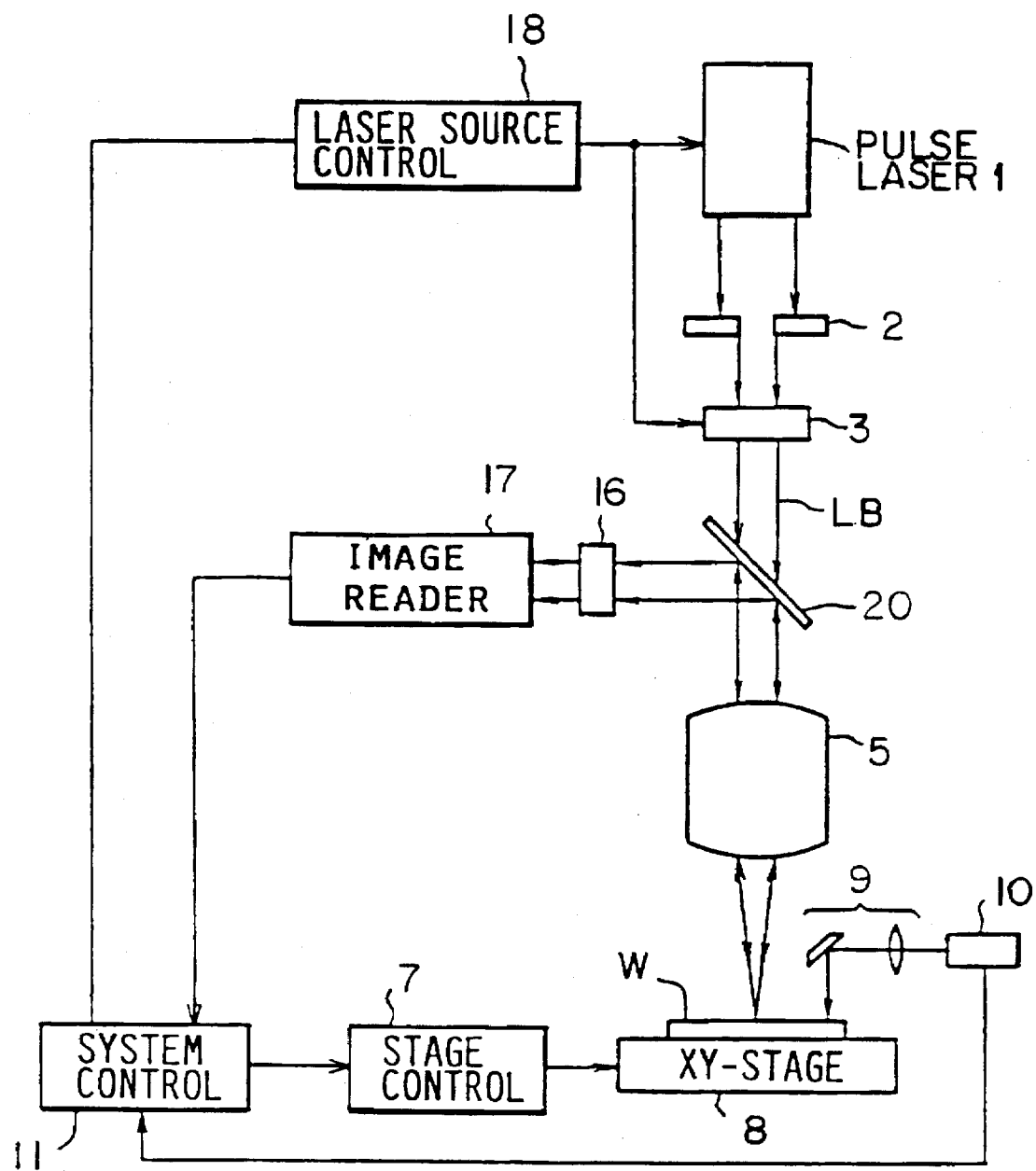
FIG. 3 shows the construction of a resist layer removing apparatus according to another embodiment of the present invention.

Then, while a description has been made of an example of the construction of the resist removing apparatus in the case where the wavelength of the laser beam LB used for resist removing purposes and the wavelength of the illuminating light LS (corresponding to the wavelength of the laser beam LA) projected from the alignment measuring system of the exposure apparatus are different from each other in connection with FIG. 1, a modified embodiment of the present invention in which the wavelength of a laser beam LB used for resist removing purposes and the wavelength of an illuminating light LS of an alignment measuring system are equal will be described with reference to FIG. 3. In FIG. 3, the same reference numerals as in FIG. 1 designate the counterpart component parts and the construction required for the relative alignment between the laser beam LB and the selected wafer mark area WA is the same as in the case of FIG. 1.

The laser beam LB emitted from the pulse laser light source 1 such as an excimer laser is formed into a given beam shape by the variable aperture stop 2 and it is then directed to the shutter 3. The shutter 3 passes or blocks the laser beam LB so that after passing through the shutter 3, the laser beam is transmitted through a half-mirror 20 to fall on the objective lens 5. The laser beam LB focused by the objective lens 5 takes the form of a spot of the similar shape as the opening shape of the variable aperture stop 2 on the wafer W and the spot irradiates the wafer mark area. As a result, the irradiated resist layer is removed gradually.

Also, the laser beam LB reflected by the wafer mark area on the wafer W returns through the initial optical path via the objective lens 5 so that it is reflected by the half-mirror 20 and then falls on the image reader 17 through the wavelength selector filter 16 (which prevents the transmission of undesired wavelengths such as the fluorescent light produced by the resist layer and which transmits the wavelength of the laser beam LB with high efficiency). The image reader 17 subjects the luminance signal of the reflected light pattern to image processing and evaluates whether the information included in the luminance signal has attained a given condition suited to the information processing required for specifying the position of the wafer mark $w_m$ by the alignment measuring system of the exposure apparatus. If it is evaluated that the information has attained the given condition, the image reader 17 transmits to the system controller 11 a command signal for stopping the irradiation of the laser beam LB. The system controller 11 receives the command signal from the image reader 17 so that a signal for stopping the laser beam LB is sent to the laser source control 18 and the removal of the resist is completed.

It is to be noted that while, in the above-described embodiments, the illuminating light (the laser beam LA) emitted from the light transmitting system of the mark detecting means is absorbed by the resist, this illuminating light need not always be of such waveform which is absorbed by the resist provided that variations in the reflected light pattern can be detected as the resist is removed. In other words, where the illuminating light has a wavelength which is transmitted through the resist and the reflection from the resist surface and the wafer surface are considered, if the convex portion is exposed, spikelike drops appear in the signal at the portions corresponding to the step. Even if the resist is not removed completely, the alignment in the exposure apparatus is possible if a signal difference sufficient for specifying the step portion can be detected and thus it is only necessary to complete the removal of the resist at this stage. However, where the energy beam (laser beam LB) for resist removal processing purposes concurrently serves as the end point discriminating illuminating light as in the case of FIG. 3, the resist removal itself cannot be effected unless its wavelength is absorbable by the resist layer.

Figure 6:
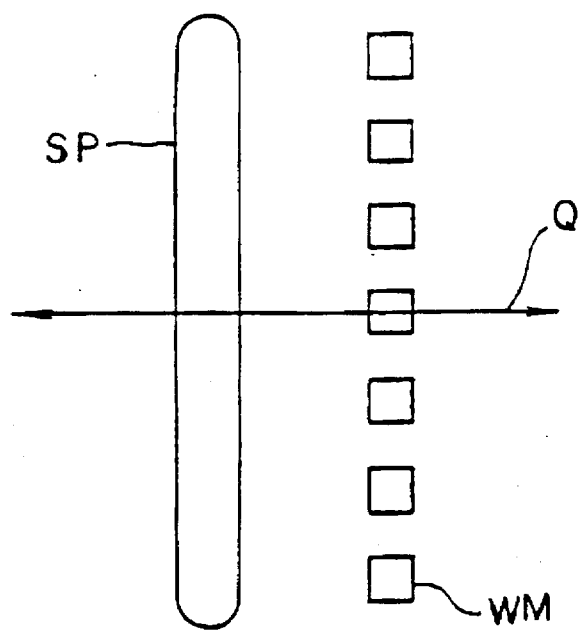
FIG. 6 is a conceptional diagram for explaining the laser step alignment (LSA) system.
Figure 7:
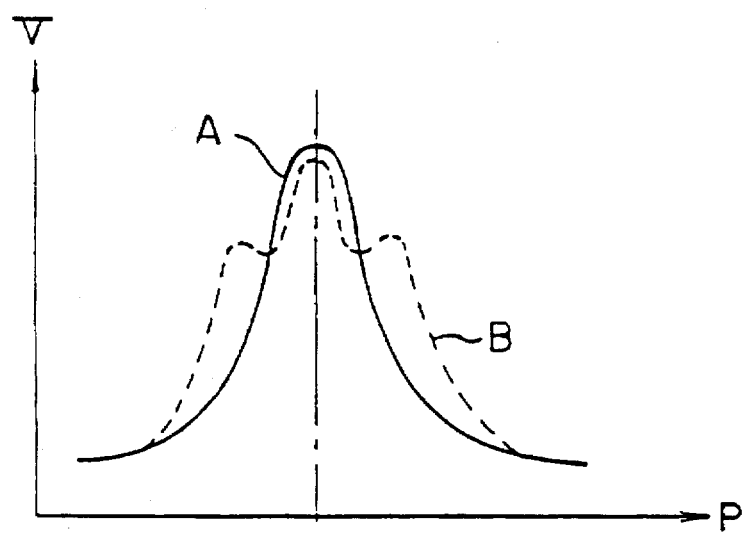
FIG. 7 shows the waveforms of signals generated from the LSA system with its ordinate V representing the signal level and the abscissa P representing the position of a scanning spot.
Figure 8:
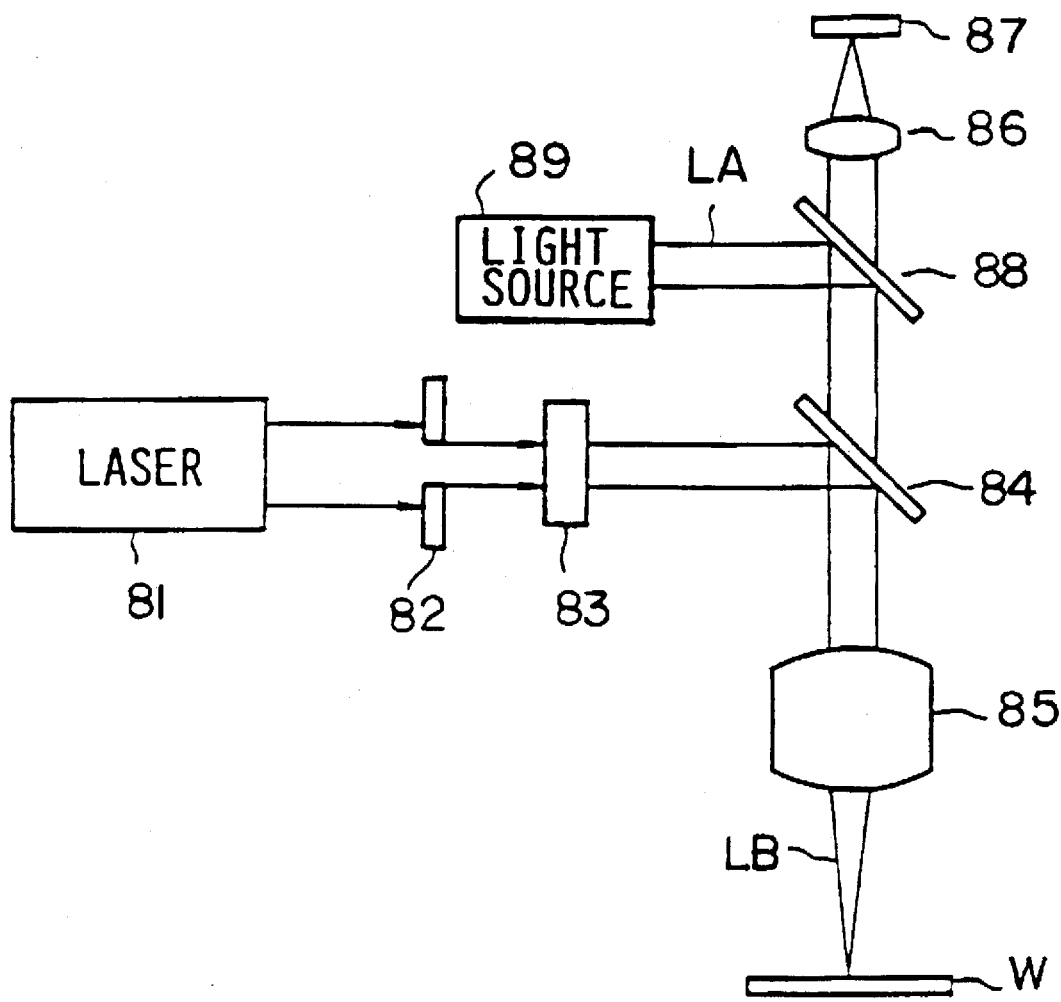
FIG. 8 shows an example of a conventional resist layer removing apparatus.

Also, while, in the above-described embodiments, the TTR-type alignment through the reticle and the projection is effected in the exposure apparatus, the present invention is not limited to the TTR method and the invention is applicable to cases employing other alignment methods. For instance, additionally shown in the exposure apparatus of FIG. 4 is a TTL-type LSA (laser step alignment) system 43 which is an alignment method of scanning a slit-like beam SP in the direction of an arrow Q relative to a diffraction grating-type mark (wafer mark WM) as shown in FIG. 6 so that the intensity of the diffracted light from the wafer mark area is detected and the wafer alignment is effected by utilizing the fact that the intensity of the diffracted light is increased to the maximum when the beam SP and the wafer mark WM are registered, and the details are disclosed in U.S. Pat. No. 4,677,301. With this alignment method, where there is no resist layer on the wafer mark area WA, a single peak is detected at the scanning position where the centers of the beam spot SP and the wafer mark WM are in registration as the curve A in FIG. 7, whereas if the resist is applied onto the wafer mark WM, smaller secondary peaks appear on both sides of the central peak corresponding to the peak produced without the resist as shown by the curve B of FIG. 7. If such secondary peaks are detected in the vicinity of the essential central peak, an error tends to be caused due to the slicing level of the signal. Also, if there is variation in the resist thickness, the resulting signal waveform becomes non-symmetric and it is impossible to make the accurate position detection.

Where the alignment measuring system of the exposure apparatus comprises such LSA system, the end point detection can be effected by the following methods in accordance with the present invention.

More specifically, as the first method, a method is conceivable in which each time the processing energy beam is irradiated or in response to each irradiation of several pulses, the wafer mark WM is scanned by the beam spot SP (either one of the stage 8 of FIG. 1 and the beam spot SP may be moved) so that the relation between the scanning position and the detection signal of the LSA system is read and recorded. In this case, the signal waveforms before and after the irradiation of the energy beam are compared so that as for example, the end point is determined depending on whether such secondary peaks as shown in the waveform of the curve B of FIG. 7 have disappeared. When making this determination of the end point, even if the secondary peaks fail to disappear completely, it is suffice if the detection signal waveform of the LSA system is such that no error is caused during the alignment operation of the exposure apparatus.

Also, as the second method, a method is conceivable in which the relation between the scanning position prior to the irradiation of the processing energy beam and the output of the detection signal of the LSA system is measured to estimate the peak position so that thereafter the slit-like beam SP is restrictively irradiated onto this peak position and the time at which the resulting LSA detection signal is increased to attain a certain value or the signal is saturated is determined as the end point.

Further, as the third method, a method is conceivable in which the illuminating light is irradiated onto the whole wafer mark area to measure the interference pattern of the diffracted light of other than the zero-order from the wafer mark area and the end point is determined in accordance with the contrast of the interference pattern or the time at which the total output of the interference light of other than the zero-order exceeds a certain value is determined as the end point.

What is claimed is:

1. In a method for selectively removing an area of a film layer which covers an alignment mark formed as a stepped structure on a surface of a substrate from said film layer which covers said surface of said substrate, the improvement comprising the steps of:

(a) irradiating an energy beam upon said area of said film layer covering said alignment mark for removing said film layer from said surface of said substrate;

(b) detecting an intensity ratio comparison between a first reflected light from said alignment mark upon its exposure during removal of said area of said film layer and a second reflected light from said area of said film layer surrounding said alignment mark;

(c) determining whether said intensity ratio comparison has reached a predetermined threshold value, during removal of said film layer; and (d) stopping irradiating said energy beam with respect to said area of said film layer covering said alignment mark when said intensity ratio has reached said predetermined threshold value.

2. A method according to claim 1, wherein said determining step includes whether said intensity ratio comparison has reached a maximum corresponding to when the intensity from said first reflected light equals the intensity from said second reflected light or not.

3. In a method for removing a photoresist film layer which covers an alignment mark formed as a stepped structure on a surface of a semiconductor substrate from said photoresist film layer which covers said surface of said semiconductor substrate, said removing process being performed prior to exposing said photoresist layer with a circuit pattern image in an exposure apparatus, the improvement comprising the steps of:

(a) irradiating an energy beam upon said photoresist film layer covering said alignment mark for removing said photoresist film layer from said surface of said substrate;

(b) detecting by means of a photoelectric detector an intensity ratio comparison between first reflected light from said alignment mark upon its exposure during removal of said photoresist layer and second reflected light from said photoresist layer surrounding said alignment mark;

(c) determining whether said intensity ratio has reached a predetermined threshold value, during removal of said photoresist layer; and (d) stopping irradiating said energy beam with respect to said photoresist layer covering said alignment mark when said intensity ratio has reached said predetermined threshold value.

4. A method according to claim 3, wherein said predetermined threshold value has the following relationship to the maximum intensity ratio: predetermined threshold value $\leq$ maximum intensity ratio.

5. A method according to claim 3, wherein said photoelectric detector is also used for aligning said substrate prior to exposing said circuit pattern image in said exposure apparatus.

6. A method according to claim 5, further comprising the step of emitting a detecting light for generating said first and second reflected lights, wherein the wavelength range of said detecting light is substantially same light used for aligning said substrate.

* * * * *